(12) United States Patent
De Rege Thesauro et al.

(10) Patent No.: US 8,597,540 B2
(45) Date of Patent: Dec. 3, 2013

(54) COMPOSITIONS FOR POLISHING SILICON-CONTAINING SUBSTRATES

(75) Inventors: Francesco De Rege Thesauro, Naperville, IL (US); Zhan Chen, Auroa, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 13/554,829

(22) Filed: Jul. 20, 2012

(65) Prior Publication Data

US 2012/0280170 A1    Nov. 8, 2012

Related U.S. Application Data

(62) Division of application No. 12/221,023, filed on Jul. 30, 2008, now Pat. No. 8,247,327.

(51) Int. Cl.
*C09K 13/06* (2006.01)

(52) U.S. Cl.
USPC ............ 252/79.4; 252/79.1; 216/83; 216/88; 216/89

(58) Field of Classification Search
USPC ........... 51/307, 309; 438/689, 692, 633, 691, 438/690, 693; 451/41, 36, 37, 398; 428/147, 537.5; 216/83, 86, 88, 89; 252/79.1; 516/63; 507/219; 166/300
See application file for complete search history.

(56) References Cited

U.S. PATENT DOCUMENTS

| | | | |
|---|---|---|---|
| 5,578,362 A | 11/1996 | Reinhardt et al. | |
| 6,022,264 A | 2/2000 | Cook et al. | |
| 6,447,563 B1 | 9/2002 | Mahulikar | |
| 2003/0228762 A1* | 12/2003 | Moeggenborg et al. | 438/691 |
| 2004/0152309 A1* | 8/2004 | Carter et al. | 438/689 |
| 2005/0221726 A1 | 10/2005 | Honma et al. | |
| 2008/0111101 A1* | 5/2008 | Keleher et al. | 252/79.1 |

FOREIGN PATENT DOCUMENTS

WO    WO 03/068882    8/2003

OTHER PUBLICATIONS

Material Safety Data Sheet—Ethylene Oxide, Airgas, pp. 1-8.*

* cited by examiner

*Primary Examiner* — Duy Deo
*Assistant Examiner* — Erin Bergner
(74) *Attorney, Agent, or Firm* — Thomas E. Omholt; Steven D. Weseman

(57) ABSTRACT

The invention provides chemical-mechanical polishing (CMP) compositions and methods for polishing a silicon-containing substrate. A method of the invention comprises the steps of contacting a silicon-containing substrate with a polishing pad and an aqueous CMP composition, and causing relative motion between the polishing pad and the substrate while maintaining a portion of the CMP composition in contact with the surface of the substrate to abrade at least a portion of the substrate. The CMP composition comprises a ceria abrasive, a polishing additive bearing a functional group with a $pK_a$ of about 4 to about 9, a nonionic surfactant with an hydrophilic portion and a lipophilic portion wherein the hydrophilic portion has a number average molecular weight of about 500 g/mol or higher, and an aqueous carrier, wherein the pH of the composition is 7 or less. The method reduces defects on the wafers, particularly local areas of high removal. The method is also useful for polishing dielectric silicon-containing substrates at a high rate relative to semiconductor silicon-containing substrates.

4 Claims, 6 Drawing Sheets

US 8,597,540 B2

COMPOSITIONS FOR POLISHING SILICON-CONTAINING SUBSTRATES

CROSS-REFERENCE TO RELATED PATENT APPLICATIONS

This patent application is a divisional of co-pending U.S. patent application Ser. No. 12/221,023, filed Jul. 30, 2008 now U.S. Pat. No. 8,247,327.

FIELD OF THE INVENTION

This invention pertains to chemical-mechanical polishing compositions and methods for polishing a silicon-containing substrate. More particularly, this application relates to chemical-mechanical polishing compositions containing a ceria abrasive, a polishing additive and a surfactant, and methods of their use.

BACKGROUND OF THE INVENTION

Chemical-mechanical planarization, or chemical-mechanical polishing (CMP), is a well known technique used to planarize substrates. CMP utilizes a chemical composition, known as a CMP composition (which also is referred to as a CMP slurry) for removal of material from the substrate. Polishing compositions typically are applied to a substrate by contacting the surface with a polishing pad (e.g., polishing cloth, or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

Conventional CMP compositions and methods typically are not entirely satisfactory at planarizing substrates. In particular, CMP polishing compositions and methods can result in less than desirable polishing rates and high surface defectivity when applied to a substrate. Because the performance of many substrates is directly associated with obtaining a planar and defect free surface, it is crucial to use a CMP composition and method that results in a high polishing efficiency, selectivity, uniformity, and removal rate and leaves a high quality polish with minimal surface defects.

Polishing slurries that provide high polishing rates on silicon metal oxides and low polishing rates on polysilicon, also know as "reverse poly" or "oxide stop on poly" slurries, are desired. Such slurries are needed in the processing of various integration schemes including floating gate electrodes. The difficulty in achieving high oxide-to-polysilicon selectivity is believed to be due to the very facile removal of polysilicon in typical dielectric slurries (for example: high pH silica-based slurries).

In conventional polishing slurries containing ceria, the use of low levels (below 0.5 wt. %) of ceria can lead to local areas of overly high removal. This is demonstrated in FIG. 1 wherein, on wafer (2), features (1) represent examples of local areas of high removal and each contour line represents a 10 nm topography change into the wafer. These isolated regions of overly high removal are sometimes called "pitting", "staining", "spots" or "hot spots". These spots are depressions in the surface that typically, are on the order of about 0.001 to about 10 $mm^2$ in area, and are typically, about 2 to about 200 nm in depth.

Accordingly, there is a need for methods and compositions, which enable the reliable use of low solids ceria slurries for polishing silicon-containing substrates in reverse poly applications, while also providing good surface uniformity.

BRIEF SUMMARY OF THE INVENTION

The invention provides a chemical-mechanical polishing (CMP) method and composition for polishing a silicon-containing substrate, the method comprising, consisting essentially of or consisting of the steps of contacting a silicon-containing substrate with a polishing pad and a CMP composition, and causing relative motion between the polishing pad and the substrate while maintaining a portion of the CMP composition in contact with the surface of the substrate to abrade at least a portion of the surface of the substrate, thereby polishing the substrate. The CMP composition has a pH of about 7 or less, and comprises, consists essentially of, or consists of an aqueous carrier containing a ceria abrasive, a polishing additive bearing a functional group with a $pK_a$ of about 4 to about 9, and a nonionic surfactant with a hydrophilic portion and a lipophilic portion. The hydrophilic portion of the nonionic surfactant has a number average molecular weight of at least about 500 g/mol.

DETAILED DESCRIPTION OF THE INVENTION

Figure 1:
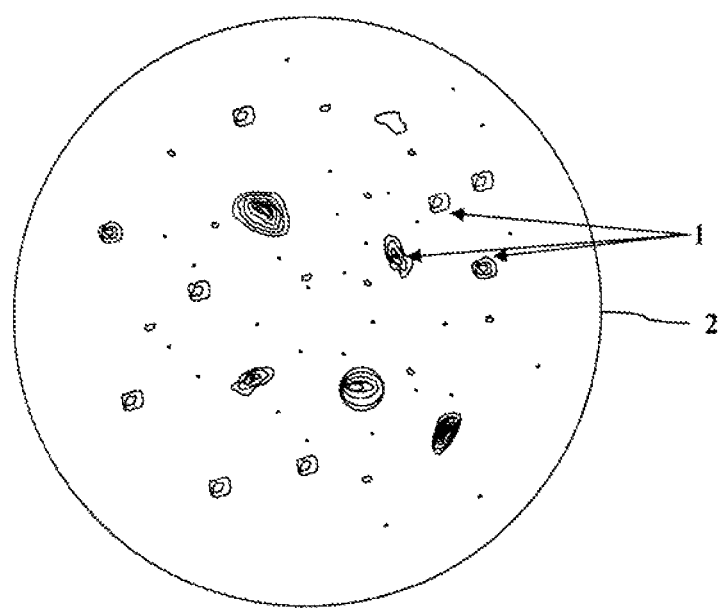
FIG. 1 is a topographical representation of local areas of high removal on a silicon-containing wafer.

The present invention provides a chemical-mechanical polishing (CMP) method for polishing a silicon-containing substrate, the method comprising, consisting essentially of or consisting of the steps of contacting a silicon-containing substrate with a polishing pad and a CMP composition, and causing relative motion between the polishing pad and the substrate while maintaining a portion of the CMP composition in contact with the surface between the pad and the substrate for a time period sufficient to abrade at least a portion of the surface of the substrate. The CMP composition comprises an aqueous carrier containing a ceria abrasive, a polishing additive bearing a functional group with a $pK_a$ of about 4 to about 9, and a non ionic surfactant including an hydrophilic portion and a lipophilic portion wherein the hydrophilic portion has a number average molecular weight of at least about 500 g/mol. The pH of the composition is about 7 or less.

The present invention provides methods and compositions for polishing silicon-containing substrates, which lower and, preferably, eliminate local areas of higher removal on the substrate (e.g., provides low levels of pitting, staining, spotting, and the like).

The present invention is particularly useful for reducing local areas of high removal, even when the ceria concentration in the CMP slurry is less than about 0.5 weight percent of the composition (wt. %) (e.g., less than about 0.2 wt. % or less than about 0.1 wt. %) ceria. The concentration of ceria used is typically, greater than about 0.005 wt. % (e.g., greater than about 0.01 wt. %). Preferably, the ceria is in a concentration of about 0.005 wt. % to about 0.5 wt. % (e.g. about 0.01 wt. % to about 0.1 wt. %).

The ceria abrasive can have any suitable primary particle size. The primary particle size, desirably, is measured by a laser diffraction technique. Typically, the abrasive has an average primary particle size of about 200 nm or less, preferably, about 180 nm or less (e.g., about 160 nm or less, about 140 nm or less, or about 120 nm or less). Typically, the abrasive has an average primary particle size of at least about 10 nm, preferably, at least about 20 nm (e.g., at least about 40 nm, at least about 60 nm, or at least about 80 nm). Typically, the ceria abrasive has an average primary particle size of between about 10 nm and about 180 nm (e.g. about 40 nm to about 120 nm).

The CMP composition, preferably, is resistant to particle agglomeration, such that the average agglomerate particle size is about 300 nm or less (e.g., 250 nm or less, or even 200 nm or less). The absence of agglomeration is also reflected in the overall width of the particle size distribution, which typically, is ± about 35% (e.g., ± about 25%, or even ± about 15%) of the average primary particle size.

The polishing additive is included in the polishing composition to modify the surface properties of the silicon-containing dielectric layer being polished so as to make the surface more receptive to interaction with abrasive particles. The pH of the polishing composition plays an important role in determining the interactions between the polishing additives and the surface of the silicon-containing dielectric layer. The polishing composition typically, has a pH of about 7 or less, preferably, about 6.5 or less (e.g., about 5.5 or less). The polishing composition typically, has a pH of at least about 2, preferably, at least about 3 (e.g., at least about 3.5). In order for the polishing additive to interact with the silicon-containing dielectric layers within this pH range, the polishing additive desirably, bears a functional group having a $pK_a$ (in water) of about 4 to about 9, preferably, about 4 to about 7 (e.g., about 4 to about 6). Moreover, it is desirable that the polishing additive has an overall net charge that is more positive than about −1 (e.g., a net charge=0, +1, +2, etc.). The net charge is determined to be the charge of the polishing additive when the functional group having a $pK_a$ in the range of about 4 to about 9 is protonated.

The functional group of the polishing additive can be any suitable functional group, and typically, is selected from amines, carboxylic acids, alcohols, thiols, sulfonamides, imides, hydroxamic acids, barbituric acids, hydrazines, amidoximes, salts thereof, and combinations thereof. Polishing additives bearing these functional groups and having a $pK_a$ of about 4 to about 9 include one or more compounds selected from the group, consisting of an arylamine, an aminoalcohol, an aliphatic amines, a heterocyclic amine, a hydroxamic acid, an aminocarboxylic acid, a cyclic monocarboxylic acid, an unsaturated monocarboxylic acid, a substituted phenol, a sulfonamide, a thiol, and a combination thereof. Preferably, the polishing additive comprises one or more compounds selected from the group consisting of an arylamine, a heterocyclic amine, an aminocarboxylic acid, and a combination thereof. Any of the foregoing polishing additives may exist in the form of a salt, for example a salt selected from the group consisting of hydrochloride salts, hydrobromide salts, sulfate salts, sulfonate salts, trifluoromethanesulfonate salts, acetate salts, trifluoroacetate salts, picrate salts, perfluorobutyrate salts, sodium salts, potassium salts, ammonium salts, halide salts, or the like.

The arylamine can be any suitable arylamine having a $pK_a$ of about 4 to about 9. Preferably, the arylamine is a primary arylamine. The arylamine optionally, can be substituted with one or more substituents selected from the group consisting of $C_{1-12}$ alkyl, $C_{1-12}$ alkoxy, $C_{6-12}$ aryl, carboxylic acid, sulfonic acid, phosphatic acid, hydroxyl, thiol, sulfonamide, acetamide, salts thereof, and combinations thereof. For example, the arylamine can be aniline, 4-chloroaniline, 3-methoxyaniline, N-methylaniline, 4-methoxyaniline, p-toluidine, anthranilic acid, 3-amino-4-hydroxybenzene sulfonic acid, an aminobenzyl alcohol, an aminobenzyl amine, 1-(2-aminophenyl)pyrrole, 1-(3-aminophenyl)ethanol, 2-aminophenylether, 2,5-bis-(4-aminophenyl)-1,3,4-oxadiazole, 2-(2-aminophenyl)-1H-1,3,4-triazole, 2-aminophenol, 3-aminophenol, 4-aminophenol, a dimethylaminophenol, 2-aminothiolphenol, 3-aminothiolphenol, 4-aminothiolphenol, 4-aminophenyl methyl sulfide, 2-aminobenzenesulfonamide, orthanilic acid, 3-aminobenzene boronic acid, 5-aminoisophthalic acid, sulfacetamide, sulfanilic acid, o-arsanilic, p-arsanilic acid, (3R)-3-(4-trifluoromethylphenylamino)pentanoic acid amide, salts thereof, and combinations thereof.

The aminoalcohol can be any suitable aminoalcohol having a $pK_a$ of about 4 to about 9. For example aminoalcohol can be selected from the group consisting of triethanolamine, benzyldiethanolamine, tris(hydroxymethyl)aminomethane, hydroxylamine, tetracycline, salts thereof, and combinations thereof. Preferably, the aminoalcohol is a tertiary aminoalcohol.

The aliphatic amine can be any suitable aliphatic amine having a $pK_a$ of about 4 to about 9. Suitable aliphatic amines include methoxyamine, hydroxylamine. N-methylhydroxylamine, N,O-dimethylhydroxylamine, β-difluoroethylamine, ethylenediamine, triethylenediamine, diethyl butylamino-(2-hydroxyphenyl)methyl)phosphonate, an iminoethane, an iminobutane, triallylamine, a cyanoamine (e.g., aminoacetonitrile, diethylaminoacetonitrile, 2-amino-2-cyanopropane, an (isopropylamino)propionitrile, a (diethylamino)propionitrile, an aminopropionitrile, dicyanodiethylamine, 3-(dimethylamino)propionitrile, salts thereof, and a combination thereof. The aliphatic amine can also be a hydrazine. Preferably, the hydrazine comprises one or more compounds selected from the group consisting of hydrazine, methylhydrazine, tetramethylhydrazine, N,N-diethylhydrazine, phenylhydrazine, N,N-dimethylhydrazine, trimethylhydrazine, ethylhydrazine, salts thereof (e.g., hydrochloride salts), and a combination thereof.

The heterocyclic amine can be any suitable heterocyclic amine having a $pK_a$ of about 4 to about 9, including monocyclic, bicyclic, and tricyclic amines. Typically, the cyclic amine is a 3-, 4-, 5- or 6-membered cyclic structure comprising one or more nitrogen atoms and one or more other atoms such as carbon, carbon and oxygen, carbon and sulfur, and the like. Preferably, the cyclic amine is a 5- or 6-membered cyclic structure. The heterocyclic amine optionally, is substituted by one or more substituents selected from the group consisting of H, OH, COOH, SO$_3$H, PO$_3$H, Br, Cl, I, F, NO$_2$, hydrazine, a C$_{1-8}$ alkyl (optionally substituted with OH, COOH, Br, Cl, I, or NO$_2$), a C$_{6-12}$ aryl (optionally substituted with OH, COOH, Br, I, or NO$_2$), C(O)H, C(O)R (where R is a C$_{1-8}$ alkyl or a C$_{6-12}$ aryl), and a C$_{1-8}$ alkenyl. Desirably, the heterocyclic amine contains at least one unsubstituted heterocyclic nitrogen. For example, the heterocyclic amine can be imidazole, 1-methylimidazole, 2-methylimidazole, 2-ethylimidazole, 2-hydroxymethylimidazole, 1-methyl-2-hydroxymethylimidazole, benzimidazole, quinoline, isoquinoline, hydroxyquinoline, melamine, pyridine, bipyridine, 2-methylpyridine, 4-methylpyridine, 2-aminopyridine, 3-aminopyridine, 2,3-pyridinedicarboxylic acid, 2,5-pyridinedicarboxylic acid, 2,6-pyridinedicarboxylic acid, 5-butyl-2-pyridinecarboxylic acid, 4-hydroxy-2-pyridinecarboxylic acid, 3-hydroxy-2-pyridinecarboxylic acid, 2-pyridinecarboxylic acid, 3-benzoyl-2-pyridinecarboxylic acid, 6-methyl-2-pyridinecarboxylic acid, 3-methyl-2-pyridinecarboxylic acid, 6-bromo-2-pyridinecarboxylic acid, 6-chloro-2-pyridinecarboxylic acid, 3,6-dichloro-2-pyridinecarboxylic acid, 4-hydrazino-3,5,6-trichloro-2-pyridinecarboxylic acid, quinoline, isoquinoline, 2-quinolinecarboxylic acid, 4-methoxy-2-quinolinecarboxylic acid, 8-hydroxy-2-quinolinecarboxylic acid, 4,8-dihydroxy-2-quinolinecarboxylic acid, 7-chloro-4-hydroxy-2-quinolinecarboxylic acid, 5,7-dichloro-4-hydroxy-2-quinolinecarboxylic acid, 5-nitro-2-quinolinecarboxylic-acid, 1-isoquinolinecarboxylic acid, 3-isoquinolinecarboxylic acid, acridine, benzoquinoline, benzacridine, clonidine, anabasine, nomicotine, triazolopyridine, pyridoxine, serotonin, histamine, benzodiazepine, aziridine, morpholine, 1,8-diazabicyclo[5,4,0]undecene-7 (DABCO), hexamethylenetetramine, piperazine, N-benzoylpiperazine, 1-tosylpiperazine, N-carbethoxypiperazine, 1,2,3-triazole, 1,2,4-triazole, 2-aminothiazole, pyrrole, pyrrole-2-carboxylic acid and alkyl, halo, or carboxylic acid-substituted derivatives thereof, 3-pyrroline-2-carboxylic acid, ethylpyrroline, benzylpyrroline, cyclohexylpyrroline, tolylpyrroline, tetrazole, 5-cyclopropyltetrazole, 5-methyltetrazole, 5-hydroxytetrazole, 5-phenoxytetrazole, 5-phenyltetrazole, salts thereof, and combinations thereof. The heterocylic amine also can be an imide, an aminidine, or a barbituric acid compound. For example, suitable imides include fluorouracil, methylthiouracil, 5,5-diphenylhydantoin, 5,5-dimethyl-2,4-oxazolidinedione, phthalimide, succinimide, 3,3-methylphenylglutarimide, 3,3-dimethylsuccinimide, salts thereof, and combinations thereof. Suitable aminidines include imidazo[2,3-b]thioxazole, hydroxyimidazo[2,3-a]isoindole, salts thereof, and combinations thereof. Suitable barbituric acids include 5,5-methylphenylbarbituric acid, 1,5,5-trimethylbarbituric acid, hexobarbital, 5,5-dimethylbarbituric acid, 1,5-dimethyl-5-phenylbarbituric acid, salts thereof, and combinations thereof.

The hydroxamic acid can be any suitable hydroxamic acid having a pK$_a$ of about 4 to about 9. Suitable hydroxamic acids include formohydroxamic acid, acetohydroxamic acid, benzohydroxamic acid, salicylhydroxamic acid, 2-aminobenzohydroxamic acids, 2-chlorobenzohydroxamic acid, 2-fluorobenzohydroxamic acid, 2-nitrobenzohydroxamic acid, 3-nitrobenzohydroxamic acid, 4-aminobenzohydroxamic acid, 4-chlorobenzohydroxamic acid, 4-fluorobenzohydroxamic acid, 4-nitrobenzohydroxamic acid, 4-hydroxybenzohydroxamic acid, salts thereof, and combinations thereof.

The aminocarboxylic acid can be any suitable aminocarboxylic acid having a pK$_a$ of about 4 to about 9. Certain common aminocarboxylic acid compounds such as proline, glycine, phenylglycine, and the like have a pK$_a$ of about 2-2.5 for the carboxylic acid moiety and about 9-10 for the amino moiety, and are not suitable for use in the context of the invention. Contrastingly, aminocarboxylic acids such as glutamic acid, beta-hydroxyglutamic acid, aspartic acid, asparagine, azaserine, cysteine, histidine, 3-methylhistidine, cytosine, 7-aminocephalosporanic acid, and camosine each contain a functional group having a pK$_a$ of in the range of about 4 to about 9.

The cyclic monocarboxylic acid can be any suitable cyclic monocarboxylic acid having a pK$_a$ of about 4 to about 9. Di- and poly-carboxylic acids previously suggested for use in polishing silicon-containing dielectric layers can have a pK$_a$ in the desired range, but have a total charge that leads to undesirable agglomeration, adhesion, and/or rapid settling of the inorganic abrasive particles. Desirably, the cyclic carboxylic acid compound comprises a C$_{4-12}$ cyclic alkyl or C$_{6-12}$ aryl group. The cyclic carboxylic acid compound optionally, is substituted by one or more substituents selected from H, OH, COOH, Br, Cl, I, F, NO$_2$, hydrazine, a C$_{1-8}$ alkyl (optionally substituted with OH, COOH, Br, Cl, I, or NO$_2$), a C$_{6-12}$ aryl (optionally substituted with OH, COOH, Br, I, or NO$_2$), C(O)H, C(O)R (where R is a C$_{1-8}$ alkyl or a C$_{6-12}$ aryl), and C$_{1-8}$ alkenyl. Preferably, the cyclic carboxylic acid compound is not a di- or poly-hydroxybenzoic acid. Suitable cyclic monocarboxylic acid, compounds include benzoic acid, C$_{1-12}$-alkyl-substituted benzoic acids, C$_{1-12}$-alkoxy-substituted benzoic acids, naphthalene 2-carboxylic acid, cyclohexane carboxylic acid, cyclohexyl acetic acid, 2-phenylacetic acid, 4-hydroxybenzoic acid, 3-hydroxybenzoic acid, 2-piperidinecarboxylic acid, cyclopropanecarboxylic acids (e.g., cis- and trans-2-methylcyclopropanecarhoxylic acid), salts thereof, and combinations thereof. Especially preferred polishing additives are 4-hydroxybenzoic acid, cyclohexane carboxylic acid, benzoic acid, salts thereof, and combinations thereof.

The unsaturated monocarboxylic acid can be any suitable unsaturated monocarboxylic acid (e.g., alkenecarboxylic acid) having a pK$_a$ of about 4 to about 9. Typically, the unsaturated monocarboxylic acid is a C$_{3-6}$-alk-2-enoic acid. Preferably, the unsaturated monocarboxylic acid comprises one or more compounds selected from the group consisting of a cinnamic acid, a propenoic acid (e.g., acrylic acid, 3-chloroprop-2-enecarboxylic acid), a butenoic acid (e.g., crotonic acid, 3-chlorobut-2-enecarboxylic acid, 4-chlorobut-2-enecarboxylic acid), pentenoic acids (e.g., cis- or trans-2-pentenoic acid, 2-methyl-2-pentenoic acid), a hexenoic acid (e.g., 2-hexenoic acid, 3-ethyl-2-hexenoic acid), salts thereof, and a combination thereof.

The substituted phenol can be any suitable substituted phenol having a pK$_a$ of about 4 to about 9. Preferably, the substituted phenol contains a substituent selected from nitro, chloro, bromo, fluoro, cyano, alkoxycarbonyl, alkanoyl, acyl, alkylsulfonyl, and combinations thereof. Suitable nitrophenols include nitrophenol, 2,6-dihalo-4-nitrophenols, 2,6-di-C$_{1-12}$-alkyl-4-nitrophenols, 2,4-dinitrophenol, 2,6-dinitrophenol, 3,4-dinitrophenol, 2-C$_{1-12}$-alkyl-4,6-dinitrophenols, 2-halo-4,6-dinitrophenols, dinitro-o-cresol, trinitrophenols such as picric acid, salts thereof, and combinations thereof.

The sulfonamide can be any suitable sulfonamide having a pK$_a$ of about 4 to about 9. Suitable sulfonamides include N-chlorotolylsulfonamide, dichlorophenamide, mafenide, nimesulide, sulfamethizole, sulfaperin, sulfacetamide, sulfadiazine, sulfadimethoxine, sulfamethazine, sulfapyridine, sulfaquinoxaline, salts thereof, and combinations thereof.

The thiol can be any suitable thiol having a $pK_a$ of about 4 to about 9. Suitable thiols include hydrogen sulfide, cysteamine, cysteinylcysteine, methyl cysteine, thiophenol, p-cholorthiophenol, o-aminothiophenol, o-mercaptophenylacetic acid, p-nitrobenzenethiol, 2-mercaptoethanesulfonate, N-dimethylcysteamine, dipropylcysteamine, diethylcysteamine, mercaptoethylmorpholine, methylthioglycolate, mercaptoethylamine, N-trimethylcysteine, glutathione; mercaptoethylepiperidine, diethylaminopropanethiol, salts thereof, and combinations thereof.

When the polishing additive is an arylamine, the polishing additive, preferably, comprises one or more compounds selected from the group consisting of aniline, anthranilic acid, an aminophenol, orthanilic acid, salts thereof, and combinations thereof. When the polishing additive is a heterocyclic amine compound, the polishing additive, preferably, comprises one or more compounds selected from the group consisting of imidazole, quinoline, pyridine, 2-methylpyridine, 2-pyridinecarboxylic acid, a pyridinedicarboxylic acid, 2-quinolinecarboxylic acid, morpholine, piperazine, a triazole, pyrrole, pyrrole-2-carboxylic acid, a tetrazole, salts thereof, and combinations thereof. When the polishing additive is an aminocarboxylic acid compound, the polishing additive, preferably, comprises one or more compounds selected from the group consisting of glutamic acid, aspartic acid, cysteine, histidine, salts thereof, and a combination thereof. When the polishing additive is a cyclic mono-carboxylic acid compound, the polishing additive, preferably, comprises one or more compounds selected from the group consisting of benzoic acid, cyclohexane carboxylic acid, cyclohexylacetic acid, 2-phenylacetic acid, a salt thereof, and a combination thereof.

The polishing composition typically, comprises about 5 wt. % or less polishing additive (e.g., about 2 wt. % or less) polishing additive. The polishing composition desirably, comprises about 0.005 wt. % or more (e.g., about 0.01 wt. % or more) polishing additive. Preferably, the polishing composition comprises about 1 wt. % or less (e.g., about 0.5 wt. % or less, about 0.2 wt. % or less) polishing additive. Preferably, the additive comprises one or more compounds selected from the group consisting of an arylamine, an aminoalcohol, an aliphatic amine, a heterocyclic amine, a hydroxamic acid, an aminocarboxylic acid, a cyclic monocarboxylic acid, an unsaturated monocarboxylic acid, a substituted phenol, a sulfonamide, a thiol, a salt thereof, and a combination thereof.

The hydrophilic portion of the surfactant comprises, consists essentially of, or consists of oxyethylene (—O—$CH_2$—$CH_2$—) repeat units, vinyl alcohol [—$CH_2$—$C_2(OH)$—] repeat units, a sorbitan group, highly substituted saturated or partially unsaturated $C_{6-30}$ alkyls, or a combination thereof (e.g., polyoxyethylenesorbitan). The highly substituted saturated or partially unsaturated $C_{6-30}$ alkyls, preferably, are substituted with one or more hydrophilic functional groups, for example a hydroxyl group. The hydrophilic portion of the nonionic surfactant typically, has a molecular weight of at least 500 g/mol (e.g., about 1000 g/mol or more, about 1500 g/mol or more, or about 3000 g/mol or more). For polymeric or oligomeric hydrophilic materials, the molecular weight, preferably, is a number average molecular weight. Compounds having a very high number average molecular weight may afford a viscosity increase that is detrimental to the slurry handling, polishing performance and slurry stability. It is, therefore, preferable to use a surfactant having a hydrophilic portion with a number average molecular weight below 1,000,000 g/mol (i.e., below 100,000 g/mol, below 50,000 g/mol or below 10,000 g/mol).

The lipophilic portion of the surfactant can be a silicone-free fragment containing a hydrocarbon moiety where there are 6 to 30 hydrocarbon units (e.g., about 10 to 20 hydrocarbon units). Preferably, the hydrocarbon moiety is an alkyl group, an alkyl substituted aryl group, an alkoxy-substituted aryl group, and an aryl-substituted alkyl group or an aryl group.

In addition, the surfactant can comprise any acetylenic glycol surfactant comprising, consisting essentially of or consisting of a tetraalkyldecyne head group and an oxyethylene tail group, such as 2,4,7,9-tetramethyl-5-decyne-4,7-diol ethoxylate. The surfactant also can be an amphiphilic nonionic surfactant such as a polyoxyethylene alkyl ether and a polyoxyethylene alkanoic acid ester, wherein the alkyl portion thereof is a $C_{6-30}$ alkyl, which can be saturated or partially unsaturated, and is optionally branched. For example, the amphiphilic nonionic surfactant can comprise a polyoxyethylene lauryl ether, a polyoxyethylene cetyl ether, a polyoxyethylene stearyl ether, a polyoxyethylene oleyl ether, a polyoxyethylene monolaurate, a polyoxyethylene monostearate, a polyoxyethylene distearate, or a polyoxyethylene monooleate. Similarly, the surfactant can be a polyoxyethylene alkylphenyl ether or polyoxyethylene alkylcyclohexyl ether, wherein the alkyl group thereof is a $C_{6-30}$ alkyl, can be saturated or partially unsaturated, and can be optionally branched, such as a polyoxyethylene octylphenyl ether, a polyoxyethylene nonylphenyl ether, or a polyoxyethylene dinonyphenyl ether.

The amphiphilic nonionic surfactant can also comprise a sorbitan alkanoic acid ester or a polyoxyethylenesorbitan alkanoic acid ester, wherein the alkyl portion thereof is a $C_{6-30}$ alkyl, which can be saturated or partially unsaturated, and can be optionally branched. For example, the amphiphilic nonionic surfactant can comprise sorbitan monolaurate, sorbitan monooleate, sorbitan monopalmitate, sorbitan monostearate, sorbitan sequioleate, sorbitan trioleate, or sorbitan tristearate, as well as a polyoxyethylenesorbitan monolaurate, a polyoxyethylenesorbitane monopalmitate, a polyoxyethylene sorbitan monostearate, a polyoxyethylene sorbitan tristearate, a polyoxyethylenesorbitan monooleate, a polyoxyethylenesorbitan triooleate, or a polyoxyethylenesorbitan tetraoleate.

Alternatively, the surfactant can comprise a polydimethicone block or graft copolymers comprising, consisting essentially of, or consisting of a polydimethicone portion and a hydrophilic oxygen-containing portion (e.g., polyoxyethylene, polyoxyethylene and polyoxypropylene, or polyoxyethylene and polyethylene, or an alkyl polyglucose, an ethoxylated ester or diester of an alkyl glucose). The block or graft copolymer can comprise combinations of the above hydrophilic portions, for example a polydimethicone portion bound to a polyoxyethylene and a polyoxypropylene copolymer, and the like.

The surfactant, preferably, is hydrophilic, as can be determined by the surfactant's Hydrophilic-Lipophilic Balance (HLB) value. The HLB value is an indication of the solubility of a surfactant in water and, thus, is related to the wt. % amount of the hydrophilic portion of the surfactant (e.g., the wt. % amount of ethylene oxide). The surfactant HLB value can be approximated, in some cases, for nonionic surfactants containing an ethylene oxide group as being equal to the weight percent (wt. %) amount of the ethylene oxide groups in the surfactant multiplied by 20, giving a value between 0 and 20. A low HLB value indicates a lipophilic surfactant (i.e., having a small amount of hydrophilic groups), and a high HLB value indicates a hydrophilic surfactant (having a high amount of hydrophobic groups). Nonionic surfactants having an HLB of 10 or greater have been classified to as being "hydrophilic" nonionic surfactants, whereas nonionic surfactants having an HLB of less than 10 have been classified as being "lipophilic" (see e.g., *The HLB System*, published by ICI United States, Inc., 1976). In a preferred embodiment, the nonionic surfactant is a hydrophilic nonionic surfactant and thus has an HLB not less than about 10 (e.g., not less than 12). In a preferred embodiment, the nonionic surfactant is a hydrophilic surfactant with an HLB less than about 19 (e.g. less than 18).

Preferred surfactants include polyoxyethylene nonylphenyl ethers and polyoxyetheylene dinonylphenyl ethers (e.g., IGEPAL® surfactants from Rhone-Poulenc, ICANOL® surfactants from BASF and LEUTENSOL® surfactants from BASF), polyoxyethylene-polyoxypropylene copolymers (e.g., PLURONIC® surfactants from BASF) and polydimethicone compolymers (e.g., SILWET® surfactants from GE Silicons).

Typically, the surfactant is present in the polishing composition at a concentration of not less than about 10 ppm, preferably, not less than about 20 ppm (e.g., not less than about 50 ppm, not less than about 100 ppm, not less than about 150 ppm or not less than about 200 ppm). Typically, the surfactant is present in a concentration not more than about 10,000 ppm, preferably, not more than about 1000 ppm (e.g., not more than about 750 ppm, or not more than about 500 ppm).

The polishing composition described herein optionally further comprises one or more components such as an anti-foaming agent and a biocide. The anti-foaming agents and biocides can be any suitable anti-foaming and antimicrobial agents, respectively, that are suitable for use in CMP slurries.

The concentration of biocide used in the polishing composition is typically, in the range of about 1 to about 50 ppm, preferably, in the range of about 10 to about 20 ppm, based on the liquid carrier and any components dissolved or suspended therein. Examples of suitable biocides include an isothiazolinone biocide.

The concentration of anti-foaming agent present in the polishing composition typically, is in the range of about 5 to about 140 ppm based on the liquid carrier and any components dissolved or suspended therein. Suitable antifoaming agents include polydimethysiloxane polymers (polydimethicones), and the like.

The polishing composition described herein also optionally comprises one or more metal complexing or sequestering agents. For example, these may comprise mono-, di-, tri- and poly-carboxylic acids (e.g., EDTA and citric acid); mono-, di-, tri-, and poly-phosphonic acids (e.g., DEQUEST® phosphonic acids, and the like), as well as mono-, di-, tri- and poly-amines.

The present invention provides methods and compositions for polishing silicon-containing dielectric materials at a higher removal rate relative to silicon-containing semiconductor materials. Typical silicon-containing dielectric materials include, for example, silicon dioxide, boron silicates, phosphorous silicates, borophosphosilicate glass (BPSG), undoped silicate glass (USG) and combinations thereof, as well as silicon nitrides and silicon oxynitrides. Typical silicon-containing semiconductor materials include for example, polysilicon, single crystal silicon, p-doped silicon, and n-doped silicon. Semiconductor materials also include such materials as the so-called III-V materials (e.g., gallium arsenide and aluminum phosphide). Typically, the present invention provides a selectivity for removal of silicon-containing dielectric materials relative to removal of silicon-containing semiconductor materials of greater than about 5 to 1 (e.g., greater than or equal to about 10 to 1, greater than or equal to about 20 to 1, or greater than or equal to about 30 to 1). Rates of polishing below 100 Å/min and close to 0 Å/min can be achieved on a silicon-containing semiconductor substrate (e.g., below 80 Å/min, below 60 Å/min or below 40 Å/min). Rates of polishing greater than 1000 Å/min can be achieved on the silicon-containing dielectric materials (e.g., greater than 2000 Å/min, greater than 3000 Å/min or greater than 4000 Å/min).

The compositions and methods of the invention are useful for polishing any suitable substrate. Preferably, the substrate comprises at least one silicon-containing layer comprising silicon dioxide (e.g., PETEOS), single crystal silicon, polycrystalline silicon (e.g., polysilicon), doped silicon (e.g., nitrogen and phosphorous doped polysilicon), low-k dielectric materials having a dielectric constant about 3.5 or less (e.g., about 1 to about 3), silicon nitrides, silicon borides, and silicon. Without limitation, the compositions and methods of the present invention are also particularly useful for polishing substrates comprising germanium.

Figure 2:
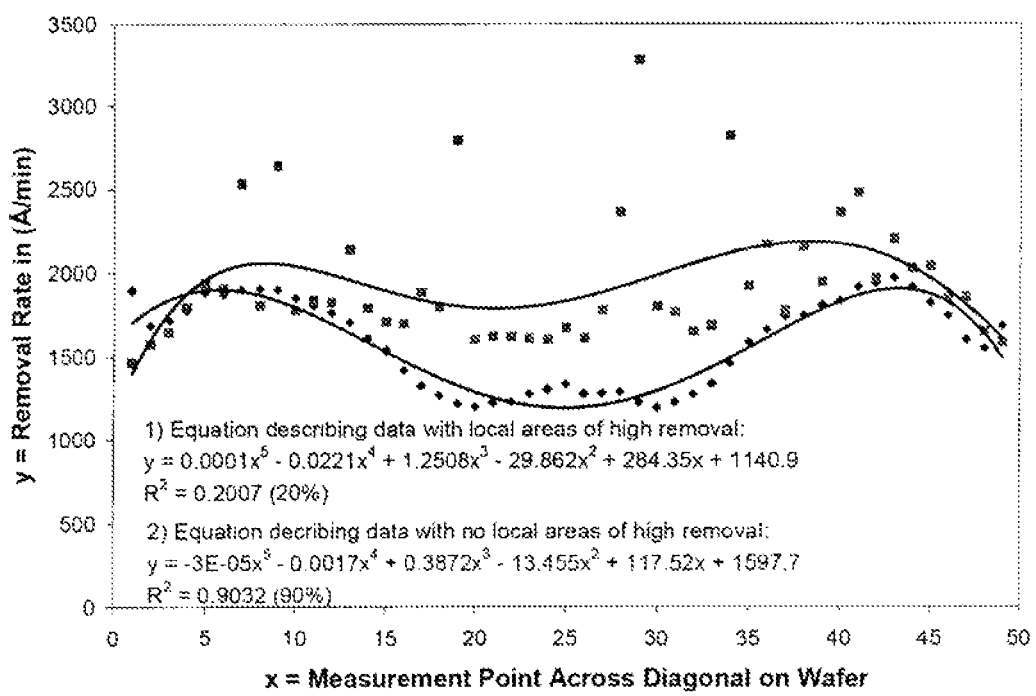
FIG. 2 is a graph of the removal rate (Å/min) versus the measurement point across the diagonal on a 200 mm diameter silicon dioxide containing wafer with local areas of high removal, and on a 200 mm diameter silicon dioxide containing wafer with no local areas of high removal.

Any method of determining the quality of the surface uniformity may be used. For the purposes of describing the present invention the following measurements will be used, without limitation. A diagonal removal rate profile is the removal rate profile measured diagonally across the wafer and can usually be described by a polynomial equation of order 5 and lower as shown in FIG. 2. For example the removal rate of a film can be calculated from the difference of the thickness before and after polishing using ellipsometry. If there are many events of local areas of high removal, the polynomial fit is poor as evident by a low least square correlation ($R^2$). The presence of fewer local areas of high removal improves the correlation. Thus, the square of the correlation coefficient, $R^2$, for a order or lower least-square fit of the diagonal removal profile can be used as a convenient tool to evaluate the surface quality of a polished wafer. In particular, an $R^2$ value of 0.5 (50%) or greater, preferably, at least 0.6 (60%) or more and, preferably, at least 0.7 (70%), indicates that the surface of the polished wafer is relatively free from local areas of overly high removal (e.g., pits, spots, stains, and the like).

Another effect of local areas of high removal is to increase the within-wafer non-uniformity; however, this parameter could be largely due to global phenomena such as low overall edge polish to center differences in polishing rate. The non-uniformity can be calculated by taking the standard deviation of the thickness difference between the pre-polished wafer and the post-polished wafer for each measurement point. The magnitude of this standard deviation compared to the total average thickness difference expressed as a percentage, is referred to herein as within-wafer non-uniformity.

Local areas of high removal can also be described by a "dishing number". The dishing number is the difference between an average high area and an average lower area on a substrate over a given distance (profile). Typically, this dishing number is used to describe depressions (dishing) between two areas of different materials, such as between a silicon oxide and a copper/silicon oxide array. As used herein, the dishing number refers to the difference between a high area and low area of the same material.

When used with the above described substrates, the methods and compositions of the present invention provide within-wafer non-uniformity values preferably, lower than about 20% (e.g. lower than about 15% or lower than about 10%). Additionally, a dishing number of less than about 80 nm, on a profile of about 1 to 5 mm, (e.g., less than about 50 nm, less than about 25 nm or less than about 10 nm) is obtained when the methods and compositions of the present invention are used.

EXAMPLES

The following examples further illustrate the invention but, of course, should not be construed as in any way limiting its scope.

Example 1

This example demonstrates the effectiveness of compositions of the present invention for reducing local areas of high removal on PETEOS and polysilicon wafers. In the present example PETEOS (silicon oxide) and polysilicon (poly) wafers (200 mm diameter) were polished with several CMP compositions of the invention using a conventional CMP apparatus. The CMP slurries that were evaluated contained about 0.1% ceria (about 100 nm diameter, mean particle size), about 1600 ppm of 2-pyridinecarboxylic acid (polishing additive), and ammonium hydroxide to adjust the pH to about 5. Each slurry also contained a surfactant in the amount shown in Table 1 or Table 2. A slurry that contained no surfactant was also utilized for comparison purposes. The polishing parameters used to polish the wafers were as follows: down force pressure in the range of about 20.2 kPa (2.95 psi) to 21.0 kPa (3.05 psi), platen speed about 110 rpm, carrier speed about 101 rpm, and flow rate about 200 ml/min. An EPIC® D100 (Cabot Microelectronics Corporation, Aurora, Ill.) concentrically grooved pad and in situ conditioning were used on the polishing tool for polishing the wafers. The wafers were polished for about 120 seconds each. The thickness of each wafer was measured at 49 equally-spaced points across the diameter of the wafer, pre- and post-polishing, and the standard deviation of the difference in total thickness for each wafer, pre- and post-polishing was determined. The percentage of the determined standard deviation compared to the total thickness difference was then calculated as a measure of polishing uniformity. Because, local areas of high removal appear as spots due to the refraction of light through silicon oxide, a visual inspection of the PETEOS wafers was also made. In contrast, local areas of high removal are more difficult to observe with the unaided eye on polysilicon. Therefore for polysilicon, visual inspection was done using an optical microscope at 5× magnification. The results of the thickness determinations and visual inspections are summarized in Table 2.

TABLE 1

PETEOS and Polysilicon Defectivity Data

| Surfactant | Wafer | % STD DEV | Visual Inspection |
| --- | --- | --- | --- |
| None (comparative) | PETEOS | 23.8 | Spots |
| 150 ppm IGEPAL ® CO-890 (Invention) | PETEOS | 13.9 | Clean |
| 150 ppm LEUTENSOL ® NP-40 (Invention) | PETEOS | 13.8 | Clean |
| 400 ppm IGEPAL ® CO-890 (Invention) | PETEOS | 13.9 | Clean |
| 400 ppm LEUTENSOL ® NP-40 (Invention) | PETEOS | 15.2 | Clean |
| None (comparative) | Poly | 9.0 | Spots |
| None (comparative) | Poly | 11.8 | Spots |
| 150 ppm IGEPAL ® CO-890 (Invention) | Poly | 5.6 | Clean |
| 150 ppm LEUTENSOL ® NP-40 (Invention) | Poly | 5.7 | Clean |
| 400 ppm IGEPAL ® CO-890 (Invention) | Poly | 6.6 | Clean |
| 400 ppm LEUTENSOL ® NP-40 (Invention) | Poly | 3.3 | Clean |
| 400 ppm LEUTENSOL ® NP-40 (Invention) | Poly | 5.4 | Clean |

The results in Table 1 demonstrate that surfactants comprising a lipophilic alkoxy-substituted aryl group and a hydrophilic polyoxyethylene group having an average mol. wt. greater than 500 g/mol are effective to reduce localized regions of high polysilicon and PETEOS removal.

Figure 3:
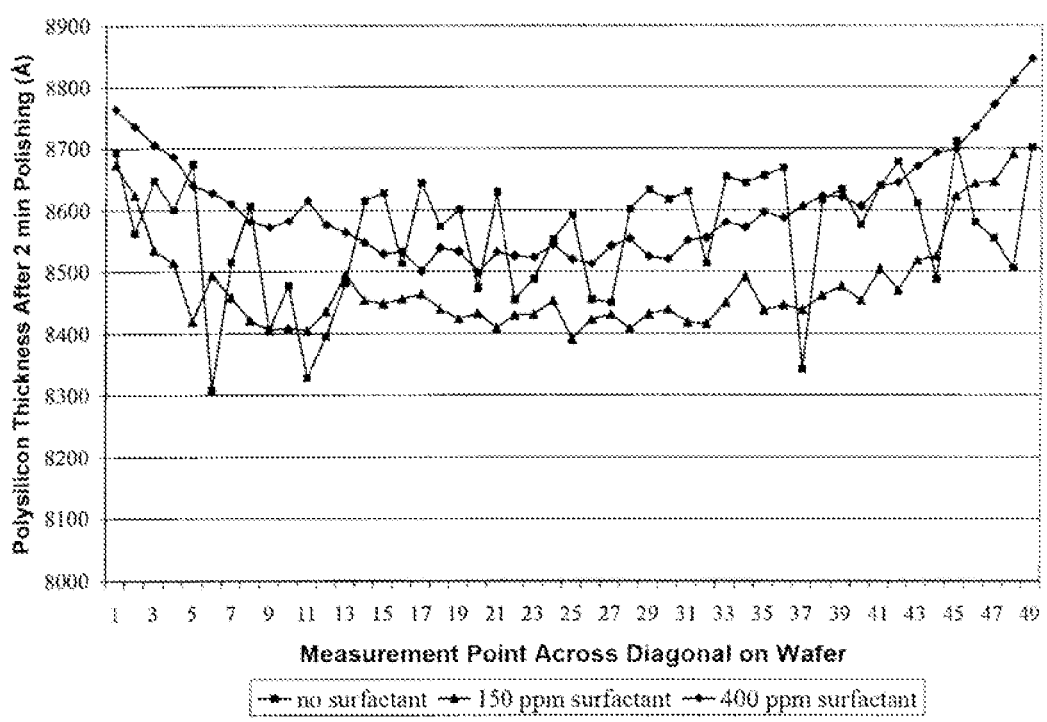
FIG. 3 is a graph of the thickness (Å) versus the measurement point across the diagonal on a 200 mm diameter polysilicon containing wafer polished with a composition containing no surfactant, a composition containing 150 ppm of a polyoxyethylene alkylphenyl ether nonionic surfactant, and a composition containing 400 ppm of the polyoxyethylene alkylphenyl ether nonionic surfactant.

FIG. 3 shows the loss (pre polish–post polish thickness) profiles of wafers polished with slurries containing 0, 150 and 400 ppm of IGEPAL® CO-890. The results indicate that addition of the surfactant smoothed out the profile across the diameter of the wafer. The degree of smoothness can be quantified by fitting the thickness (y) to the linear position (x) at the 49 measurement points to a second order polynomial expression. The following equations and least squares fits (i.e., the square of the correlation coefficient expressed as a percentage) were obtained from the combined data from all wafers at the surfactant levels shown:

$$\text{No surfactant: } y = 0.0238x^2 + 2.5426x + 8732.1; \; R^2 = 9\% \quad \text{a.}$$

$$\text{150 ppm surfactant: } y = 0.353x^2 - 16.081x + 8588.8; \; R^2 = 71\% \quad \text{b.}$$

$$\text{400 ppm surfactant: } y = 0.4392x^2 - 20.344x + 8751.2; \; R^2 = 95\%. \quad \text{c.}$$

Clearly, the methods and compositions of this invention create a profile that fits a polynomial equation more closely than the fit obtained with a conventional CMP composition containing no surfactant, as evidenced by the higher $R^2$ value when the method of the invention is applied. This result indicates that the post-polishing surface of the wafers is significantly improved by the methods and compositions of the invention.

Another way to describe local areas of high removal is by a dishing number obtained by use of an atomic force microscope (AFM) 5 mm profile scan. Table 2 shows the results of such an AFM measurement on wafers polished with 0 and 400 ppm of IGEPAL® CO-890. In Table 2, the measurement position "center" refers to a profile near the center of the wafer. "edge" refers to a profile near the edge of the wafer, and "middle" refers to a profile between the center and edge measurements.

TABLE 2

AFM Dishing Data.

| Surfactant | Measurement Position | Average Dishing (Å) |
| --- | --- | --- |
| None | Center | 832 |
| None | Middle | 804 |
| None | Edge | 864 |
| 400 ppm LEUTENSOL ® | Center | 195 |

TABLE 2-continued

AFM Dishing Data.

| Surfactant | Measurement Position | Average Dishing (Å) |
|---|---|---|
| 400 ppm LEUTENSOL ® | Middle | 200 |
| 400 ppm LEUTENSOL ® | Edge | 177 |

Clearly the presence of the surfactant in the compositions of the invention lowered the events of local high removal rates as seen by the reduction in the average pit depth.

Example 2

This example demonstrates the effectiveness of using a composition with a non-ionic surfactant wherein the hydrophilic portion has a number average molecular weight at least about 500 g/mol for polishing silicon wafers at a low polishing rate. PETEOS and polysilicon square wafers (4 cm$^2$) were polished with several CMP compositions of the invention using a conventional CMP apparatus. The CMP slurries used were similar to the slurries used for Example 1 with respect to pH, ceria concentration, and polishing additive. Each slurry also contained a surfactant in the amount shown in Table 3. The polishing parameters used to polish the wafers were the same as in Example 1 except that the flow rate was 100 mL/min and the polish time for polysilicon wafers was 30 seconds. The thickness of each wafer was measured at 9 equally spaced points across the area of the wafer, pre- and post-polishing. Table 3 shows the polishing rate for TEOS and polysilicon wafers with compositions containing various surfactants. The average molecular weight of the hydrophile is also shown in Table 3.

TABLE 3

Polishing Rates.

| Slurry description | Surfactant | Conc. (ppm) | Hydrophile mol. wt. (g/mol) | TEOS Rate (Å/min) | Polysilicon Rate (Å/min) |
|---|---|---|---|---|---|
| 1 (comparative) | IGEPAL ® CO-630 | 50 | 396 | 2679 | 360 |
| 2 (invention) | IGEPAL ® CO-730 | 150 | 528 | 2569 | 280 |
| 3 (invention) | IGEPAL ® DM-710 | 400 | 660 | 2714 | 200 |
| 4 (invention) | ICANOL ® NP-40 | 50 | 1760 | 2450 | 140 |
| 5 (invention) | ICANOL ® NP-40 | 150 | 1760 | 2538 | 80 |
| 6 (invention) | ICANOL ® NP-40 | 400 | 1760 | 2488 | 20 |
| 7 (invention) | IGEPAL ® CO-890 | 50 | 1760 | 2909 | 100 |
| 8 (invention) | IGEPAL ® CO-890 | 150 | 1760 | 2465 | 40 |
| 9 (invention) | IGEPAL ® CO-890 | 400 | 1760 | 2312 | 20 |
| 10 (invention) | IGEPAL ® CO-897 | 400 | 1760 | 2530 | 120 |
| 11 (invention) | IGEPAL ® CO-990 | 50 | 4400 | 2664 | 120 |
| 12 (invention) | IGEPAL ® CO-990 | 150 | 4400 | 2529 | 40 |
| 13 (invention) | IGEPAL ® CO-990 | 400 | 4400 | 2293 | 40 |
| 14 (comparative) | PLURONIC ® 31R1 | 50 | 325 | 2133 | 400 |
| 15 (comparative) | PLURONIC ® 31R1 | 150 | 325 | 2340 | 300 |
| 16 (comparative) | PLURONIC ® 31R1 | 400 | 325 | 2464 | 300 |
| 17 (comparative) | PLURONIC ® L101 | 400 | 380 | 1965 | 180 |
| 18 (comparative) | PLURONIC ® L101 | 150 | 380 | 2154 | 340 |
| 19 (comparative) | PLURONIC ® 17R2 | 50 | 430 | 2669 | 400 |
| 20 (comparative) | PLURONIC ® 17R2 | 150 | 430 | 2597 | 360 |
| 21 (comparative) | PLURONIC ® 17R2 | 400 | 430 | 2537 | 320 |
| 22 (invention) | PLURONIC ® P84 | 150 | 1672 | 2358 | 80 |
| 23 (invention) | PLURONIC ® P84 | 400 | 1672 | 2231 | 40 |
| 24 (invention) | PLURONIC ® F38 | 400 | 3760 | 2487 | 140 |
| 25 (invention) | PLURONIC ® F108 | 50 | 11660 | 2204 | 60 |
| 26 (invention) | PLURONIC ® F108 | 150 | 11660 | 2278 | 60 |
| 27 (invention) | PLURONIC ® F108 | 400 | 11660 | 2130 | 20 |
| 28 (comparative) | SILWET ® 7280 | 150 | 240 | 2690 | 512 |
| 29 (comparative) | SILWET ® 7280 | 400 | 240 | 2688 | 522 |
| 30 (invention) | SILWET ® L7607 | 150 | 750 | 2554 | 490 |
| 31 (invention) | SILWET ® L7607 | 400 | 750 | 2607 | 472 |
| 32 (invention) | SILWET ® L8600 | 150 | 1575 | 2643 | 382 |
| 33 (invention) | SILWET ® L8600 | 400 | 1575 | 2701 | 302 |
| 34 (invention) | SILWET ® L-7600 | 150 | 3000 | 2616 | 320 |
| 35 (invention) | SILWET ® L-7600 | 400 | 3000 | 2715 | 284 |
| 36 (invention) | SILWET ® 7001 | 150 | 9000 | 2362 | 100 |
| 37 (invention) | SILWET ® 7001 | 400 | 9000 | 2159 | 80 |
| 38 (comparative) | none | 0 | 0 | 2136 | 450 |
| 39 (comparative) | none | 0 | 0 | 2559 | 400 |
| 40 (comparative) | none | 0 | 0 | 2842 | 350 |
| 41 (comparative) | none | 0 | 0 | 1785 | 420 |
| 42 (comparative) | none | 0 | 0 | 1781 | 422 |

Figure 4:
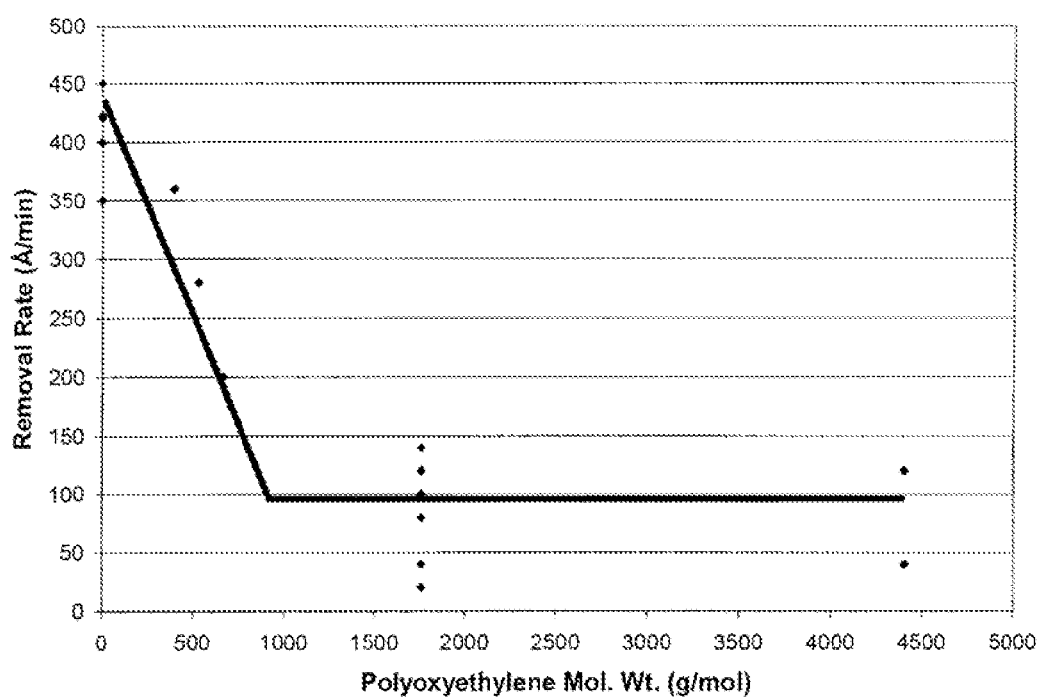
FIG. 4 is a graph of removal rate (Å/min) versus the molecular weight (g/mol) of the hydrophilic portion of nonionic polyoxyethylene alkylphenyl ether surfactants in a composition used for polishing a polysilicon containing wafer.
Figure 5:
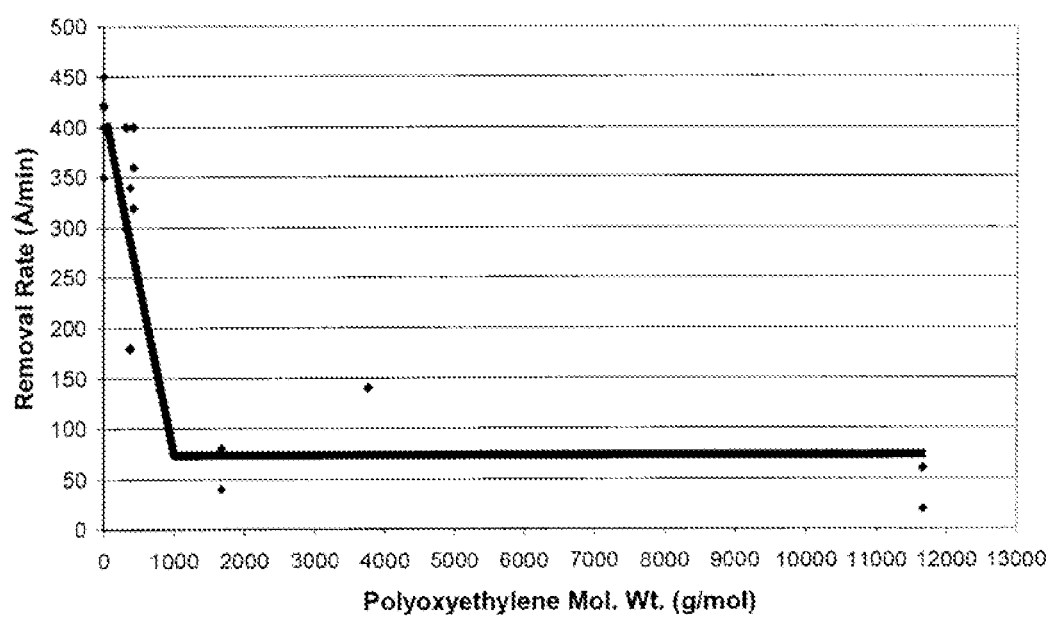
FIG. 5 is a graph of removal rate (Å/min) versus the molecular weight (g/mol) of the hydrophilic portion of nonionic, polyoxyethylene-polyoxypropylene copolymer surfactants in a composition used for polishing a polysilicon containing wafer.
Figure 6:
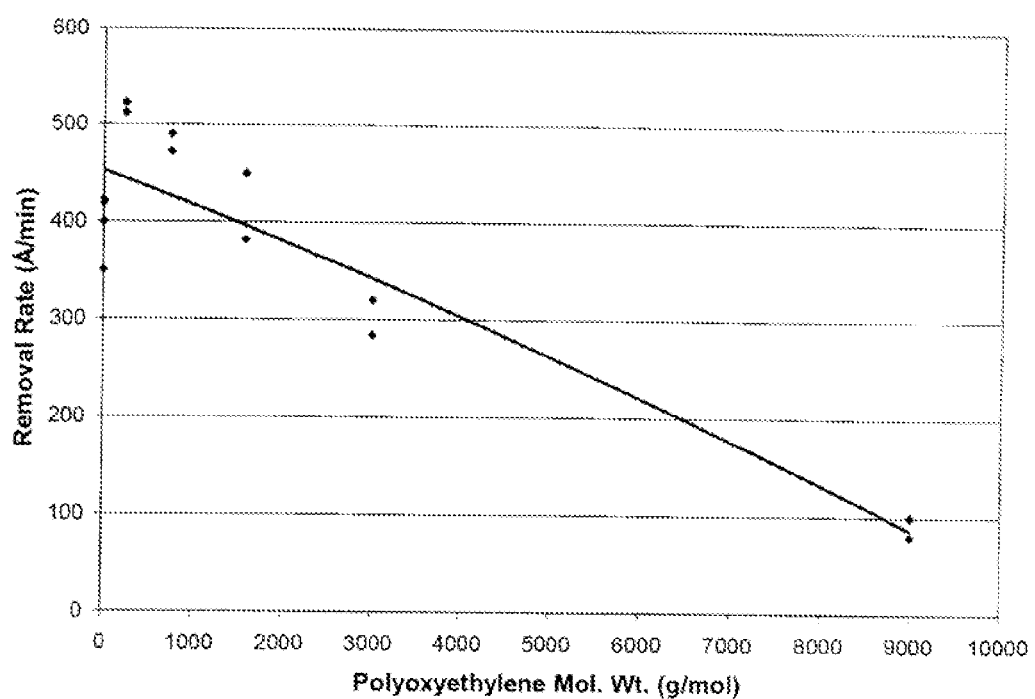
FIG. 6 is a graph of removal rate (Å/min) versus the molecular weight (g/mol) of the hydrophilic portion of nonionic, ethoxylated polydimethicone copolymer surfactants in a composition used for polishing a polysilicon containing wafer.

The data from Table 3 are plotted in FIGS. 4, 5 and 6. FIG. 4 is a plot of polishing rates on polysilicon wafers using a slurry comprising polyoxyethylene alkylphenyl ether surfactants with different sized polyoxyethylene portions and illustrates the drop in removal rate when the hydrophilic polyoxyethylene mol. wt. is greater that about 500 g/mol. FIG. 5 is a plot of polishing rates on polysilicon wafers using a slurry comprising polyoxyethylene-polyoxypropylene copolymer surfactants with different polyoxyethylene chain lengths, and illustrates the drop in removal rate where the polyoxyethylene mol. wt. is greater that about 500 g/mol. Finally, FIG. 6 is a plot of the polishing rates on polysilicon wafers using a slurry comprising ethoxylated polydimethicone copolymer surfactants with different polyoxyethylene chain lengths, and illustrates the drop in removal rate where the polyoxyethylene mol. wt. is greater that about 500 g/mol.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "consisting of" is to be construed as limiting the scope to specified materials or steps. The term "consisting essentially of" is to be construed as limiting the scope to specified materials or steps and those that do not affect the basic and novel characteristics of the claimed invention. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A CMP composition having a pH of about 5.5 or less and comprising an aqueous carrier containing a ceria abrasive in a concentration of about 0.005 wt. % to about 0.5 wt. %, wherein the ceria has an average primary particle size of between about 40 nm to about 120 nm, a polishing additive bearing a functional group having a pKa of about 4 to about 9, and a non ionic surfactant comprising a hydrophilic portion and a lipophilic portion wherein the hydrophilic portion has a number average molecular weight of 500 g/mol or higher.

2. The CMP composition of claim 1 wherein the surfactant comprises a polyoxyethylene alkylphenyl ether.

3. The CMP composition of claim 1 wherein the surfactant comprises a polydimethicone copolymer.

4. The CMP composition of claim 1 wherein the surfactant comprises a polyoxyethylene-polyoxypropylene copolymer.

* * * * *